United States Patent [19]

Hagadorn

[11] Patent Number: 5,220,291
[45] Date of Patent: Jun. 15, 1993

[54] COMPLEMENTARY TRANSISTOR OSCILLATOR

[76] Inventor: Hubert Hagadorn, 9 Light Way, Menlo Park, Calif. 94025

[21] Appl. No.: 854,251

[22] Filed: Mar. 20, 1992

[51] Int. Cl.$^5$ .............................................. H03B 5/36
[52] U.S. Cl. ............................. 331/108 A; 331/116 R; 331/185
[58] Field of Search ........... 331/108 A, 116 R, 117 R, 331/158, 185, 186

[56] References Cited

U.S. PATENT DOCUMENTS

| | | | |
|---|---|---|---|
| 2,133,642 | 10/1938 | Pierce | 331/158 |
| 2,791,644 | 5/1957 | Sziklai | 330/263 |
| 3,725,822 | 4/1973 | Eaton, Jr. | 331/108 B |
| 4,704,587 | 11/1987 | Ouyang et al. | 331/116 FE |

FOREIGN PATENT DOCUMENTS

| | | | |
|---|---|---|---|
| 61-65607 | 4/1986 | Japan | 331/116 R |
| 678632 | 8/1979 | U.S.S.R. | 331/116 R |

OTHER PUBLICATIONS

Eaton, S. S., "Timekeeping Advances Through COS/MOS Technology", RCA application note ICAN-6086, CMOS Integrated Circuits (SSD-250C), 1983, pp. 708-713.
DiMassimo, D. V., et al, "Astable and Monostable Oscillators Using RCA COS/MOS Digital Integrated Circuits", RCA application note ICAN-6466 CMOS Integrated Circuits (SSD-250C), 1983 pp. 731-736.
Mills, T. B., "HCMOS Crystal Oscillators", National Semiconductor Application Note 340, 1983, Logic Databook, vol. 1, 1984 pp. 2-138 to 2-140.
Wakeman, L., "Logic-System Design Techniques reduce Switching-CMOS Power", National Semiconductor Application Note 376, 1984, Logic Databook, vol. 1, 1984, pp. 2-242 to 2-247.
Matthys, R. J., Crystal Oscillator Circuits, 1983, John Wiley and Sons, "The Start-Up Problem", pp. 103-104; Biasing Discrete Transistors, pp. 105-107; Pierce transistor crystal oscillators, pp. 127-135.
Motorola, "Oscillator Design with High-Speed CMOS", High-Speed CMOS Logic Data (DL129, Rev. 3), 1988, pp. 4-25 to 4-26.
Boylestad, R., et al., Electronic Devices and Circuit Theory, 1972, Prentice-Hall, Inc., "Operation of Feedback Circuit as an Oscillator", pp. 597-599; Phase-Shift Oscillator, pp. 599-605; Crystal Oscillator, pp. 626-630.

Primary Examiner—Siegfried H. Grimm
Attorney, Agent, or Firm—Morrison & Foerster

[57] ABSTRACT

An oscillator of the feedback amplifier type is described that employs a complementary bipolar transistors pair in which the collectors have a common connection with the output terminal. The oscillator operates from a single power supply, provides near rail-to-rail voltage swings, and hence may interface directly with CMOS logic. Because of the relatively low base-emitter voltages operation with supply voltages less than one volt is possible.

14 Claims, 2 Drawing Sheets

COMPLEMENTARY TRANSISTOR OSCILLATOR

BACKGROUND

1. Field of the Invention

This invention relates to oscillators of the feedback amplifier type, and more specifically to oscillators employing a bipolar complementary transistor pair for the amplifier.

2. Description of the Prior Art

RC and crystal oscillator circuits are frequently used in logic circuitry for timing and control purposes. Often the amplifiers for such oscillators are constructed from integrated circuit CMOS logic inverters or logic gates so arranged. These amplifiers are conveniently powered from the existing CMOS power supply and have the advantage of directly interfacing with CMOS logic (this logic being noted for its relatively high impedance inputs and hence low loading effects).

In FIG. 1 a crystal oscillator, noted for its stability and accuracy, is shown employing a CMOS inverter 38 and a phase-shifting feedback network 22 having a high Q piezoelectric crystal 28 (Eaton, U.S. Pat. No. 3,725,822). Resistor 34 biases the amplifier in the active region (as is also true of some RC oscillators). As long as the amplifier-feedback network loop gain exceeds unity regenerative action takes place and oscillations are sustained.

In CMOS logic the supply source appears across series connected P and N channel FET gate-to-source junctions. As FET saturation current varies as the square of the difference of gate-to-source voltage from a threshold voltage, substantial currents can result when using CMOS logic ICs, particularly as may be judged for some battery applications. Alternately, if one chooses a CMOS supply voltage near the sum of the FET threshold voltages then oscillations may not occur on power-up owing to insufficient loop gain.

Thus, in some battery-sources applications and especially where supply voltage changes occur, an undesirable high supply current may have to be accepted when using CMOS inverters or gates.

SUMMARY OF THE INVENTION

A relatively simple and flexible oscillator design is presented based on an amplifier comprising a complementary pair of bipolar transistors, base bias circuitry including an input drive arrangement, and a phase-shifting network. This complementary transistor oscillator has a near rail-to-rail output voltage swing, a symmetrical output voltage waveform, is relatively efficient, and will operate over a range of supply voltages including voltages to less than one volt. Its current consumption is generally less sensitive to supply voltage than for similar oscillators employing integrated circuit CMOS logic inverters or gates. This oscillator may be powered from the CMOS logic supply, for instance, and thereby directly interface CMOS logic. In general, it should be possible to construct these oscillators from off-the-shelf components, and unlike oscillators constructed from discrete FETs, static charge considerations should be of lesser concern.

The collectors of the transistors have a common connection to the amplifier output. A base-biasing arrangement consists of a resistor connected from the base of each transistor to the amplifier output. The addition of two more resistors is shown to reduce the already low supply voltage requirements. The amplifier input may be directly connected to one of the transistor bases and capacitively connected to the other base, or may be capacitively coupled to both bases, the choice depending on the DC conductivity of the phase-shifting feedback network.

A complementary transistor crystal oscillator is described in some detail that employs a 32,768 Hz watch crystal, operates from two series-connected standard 1.5 volt batteries, requires three microamps of current, and has a frequency stability of 2 ppm for an operating supply voltage range from 2.4 to 3.2 volts.

DETAILED DESCRIPTION OF A PREFERRED EMBODIMENT

Figure 2:
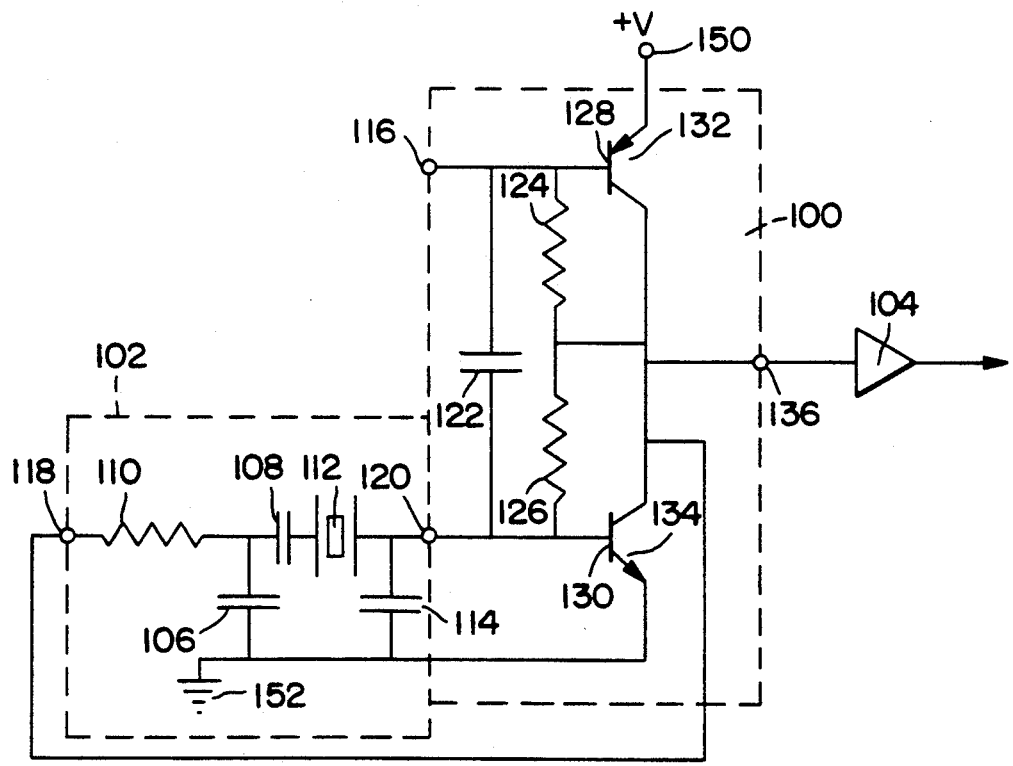
FIG. 2 is a schematic diagram of a preferred embodiment of the present invention.

An exemplary schematic for a preferred embodiment of a complementary transistor oscillator is given by the crystal oscillator circuit of FIG. 2. An amplifier 100, phase-shift feedback network 102, and a buffer amplifier 104 are shown. The amplifier section consists of a complementary pair of bipolar transistors, a PNP transistor 132, and an NPN transistor 134. The emitters of the PNP and NPN transistors are connected to the positive supply terminal 150, and the negative supply terminal 152 (ground), respectively. The collectors are common with output node 136. Resistor 124 is connected between base 128 of PNP transistor 132 and output node 136. Similarly, resistor 126 is connected between base 130 of NPN transistor 134 and output node 136. These two resistors 124 and 126 establish an active region of operation for transistor pair 132 and 134. The values of resistors 124 and 126 should be sufficiently large so as not to appreciably affect the gain of the feedback loop and yet small enough that adequate loop gain exists for start-up purposes and to obtain a full amplitude output signal; values in the range of megohms are common. Amplifier input 120 is shown to directly drive the base of NPN transistor 134 while the base of PNP transistor 132 is driven by means of coupling capacitor 122. Thus, a push-pull drive is achieved. Alternately, amplifier input 116 may be chosen, thereby directly driving the base of PNP transistor 132 with a capacitive coupled drive to the base of the NPN transistor 134.

Figure 1:
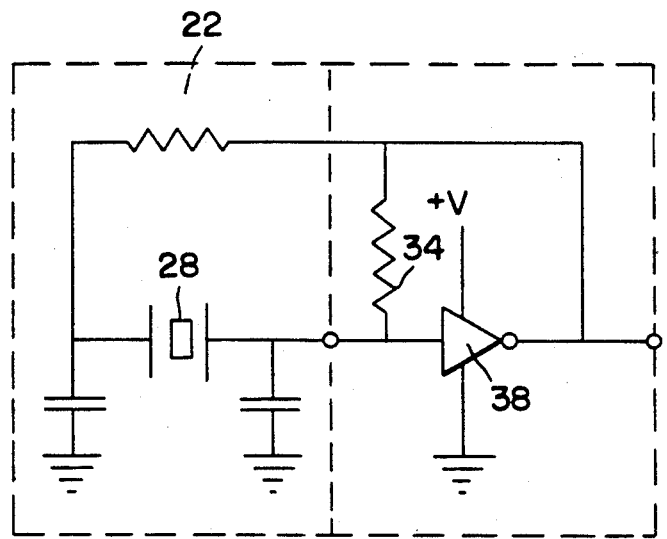
FIG. 1 is a schematic diagram of a prior art CMOS crystal oscillator circuit.

Feedback network 102 has an input 118 and an output 120. This network 102 is substantially identical to feedback network 22 of FIG. 1 except that a so-called pull-up capacitor 108 is included in series with crystal 112. The function of capacitor 108 is to slightly increase the oscillation frequency and/or to reduce loading effects. In general, its use is not imperative for oscillation. Feedback network 102 consists of input resistor 110, and a crystal pi connection of components consisting of capacitors 106 and 114, and series-connected crystal 112 and capacitor 108. Resistor 110 serves to increase phase lag and reduce excessive crystal drive, but often is simply a short. The output 120 of the feedback network 102 is shown directly connected to the base 130 of NPN transistor 134. Alternately, this connection can be made at input 116 that is directly connected to base 128 of PNP transistor 132.

Additionally, an optional CMOS buffer amplifier 104 is shown which serves to square up the oscillator output waveform and buffer the oscillator from externally driven circuitry.

From quiescent considerations, a maximum supply current condition occurs for both the CMOS and the complementary bipolar resistor oscillators when the input is such that both complementary transistors are approximately equally turned on. Generally, this occurs when the input voltage is approximately half the supply voltage. As a result a significant supply current can exist due to slow transitions of the feedback signal, certainly when compared to logic signals. In CMOS oscillators such as described in FIG. 1, the supply source appears across the series-connected P and N channel FET gate-to-source junctions. At CMOS supply voltages in excess of the sum of the P and N channel threshold voltages (which normally is true) the FET drain saturation current varies as the square of the difference of gate-to-source voltage from a threshold voltage and hence a marked supply current sensitivity can result. This has been particularly noted for the high-speed CMOS logic series. In FIG. 2 the supply voltage (+V to Ground) appears in series with the base-emitter junctions of the two transistors 132 and 134 and the two bias resistors 124 and 126. Thus, some supply voltage appears across base bias resistors 124 and 126 moderating the increase in collector saturation currents and hence supply current. At supply voltages somewhat greater than the sum of the base-emitter voltages, base currents will vary approximately linearly with supply voltage. Assuming the transistor betas remain relatively constant (as may be aided by the choice of transistors), the collector currents will vary linearly with supply voltage, in contrast to the square law dependency for CMOS logic. This is an advantage in some battery-sourced low-current applications where appreciable voltage changes can occur.

To further illustrate, a specific oscillator design follows for a timekeeping application that utilizes a 32,768 Hz watch crystal, and where the supply voltage ranges from 2.4 to 3.2 volts, as may occur from a series connection of two standard 1.5 volt batteries. The following component values were chosen:

| Ref. | Type | Description |
|------|------|-------------|
| 104 | CMOS gate | ¼ CD4011B |
| 106 | capacitor | 47 pf |
| 108 | capacitor | 27 pf |
| 110 | resistor | 560K |
| 112 | crystal | 32,7678 Hz watch crystal |
| 114 | capacitor | not required |
| 122 | capacitor | 0.01 uf |
| 124 | resistor | 10M |
| 126 | resistor | 10M |
| 132 | PNP transistor | 2N5087 |
| 134 | NPN transistor | 2N5089 |

The choice of transistors 132 and 134 for this low-power application was based on availability, low cost, and a high beta at collector currents of the order of 20 microamps, and at a one volt collector-to-emitter supply voltage. For the above supply range the oscillator supply currents varied from 1.5 to 2.0 μa while the CD4011B logic gate 104 (connected as an inverter) consumed an additional 0.9 to 1.3 μa. The oscillator frequency varied from 32,767.92 Hz at 2.4 volts to 32,767.98 Hz at 3.2 volts, for a 2 ppm frequency change. The output duty cycle of gate 104 was nearly constant at 52%. This oscillator was observed to operate at supply voltages to 1.1 volt excluding CMOS logic gate supply voltage limitations.

Figure 3:
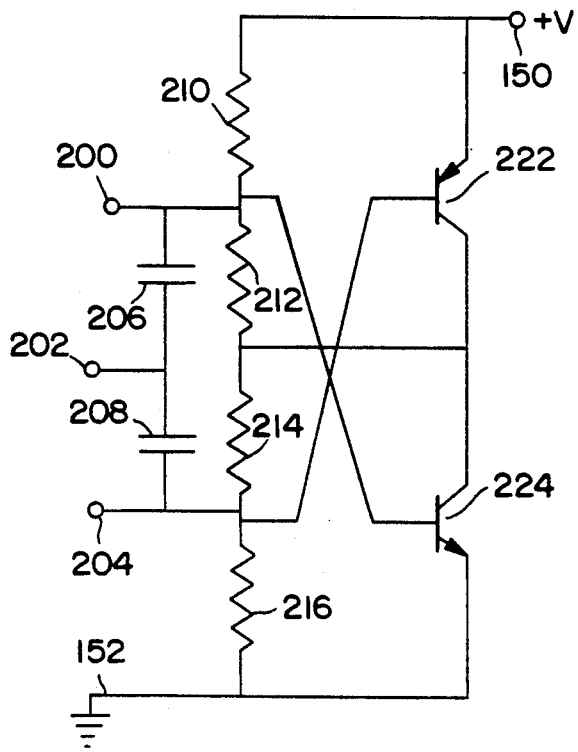
FIG. 3 is a schematic diagram of a preferred low voltage-biasing arrangement of the present invention.

Referring to FIG. 3, an alternate base bias arrangement is shown that allows operation at reduced supply voltages. Transistors 222 and 224 are the complementary pair of transistors, equivalent to transistors 132 and 134 in FIG. 2. Bias resistors 212 and 214 are connected similarly as bias resistors 124 and 126 in FIG. 2. Shunt paths to the supply voltage terminals are provided by resistors 210 and 216. Neglecting base loading effects, as resistors 212 and 214 are decreased in value relative to resistors 210 and 216, the supply voltage requirement approaches that of a single base-emitter junction.

Three possible amplifier inputs are denoted by nodes 200, 202, and 204. When the feedback network does not block DC voltages, then the input should be taken at node 202; otherwise, node 200 or 204 should be used. In the latter case the two series capacitors 206 and 208 may be replaced by a single capacitor.

Again to cite a specific example, this biasing arrangement was applied to the example oscillator circuit above with all four resistor values equal to 10 megohms. Oscillation was observed for supply voltages to 0.65 volt.

Figure 4:
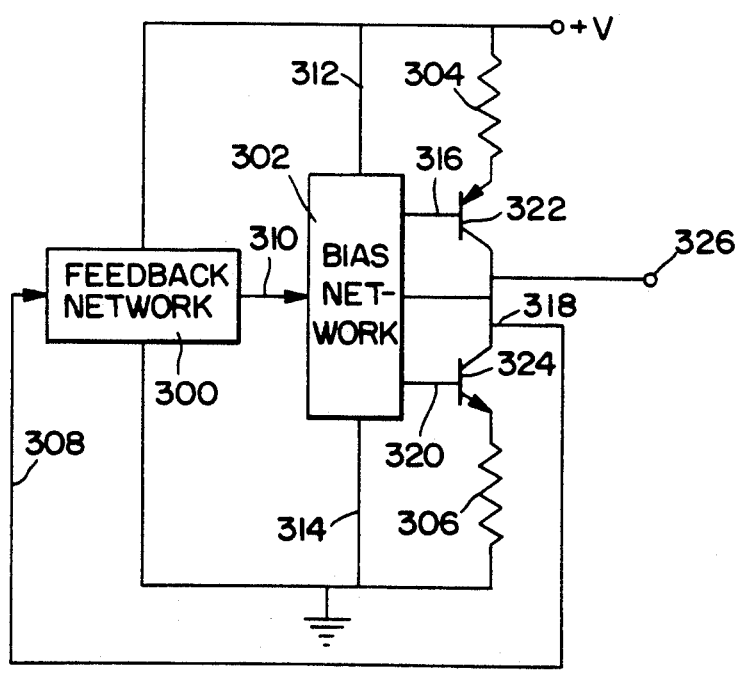
FIG. 4 is a generalized block/schematic diagram of the present invention.

In FIG. 4 a generalized schematic/block diagram of the complementary transistor oscillator is given. As previously indicated, the bipolar transistors 322 and 324 have both collectors common with amplifier output 326. Impedances 304 and 306 are shown connected between emitters and supply terminals. These impedances may decrease loading effects on the bias circuitry, improve frequency stability, provide a larger supply voltage operating range, render the output waveform more sinusoidal, etc., as should be apparent to those skilled in the art of transistor circuit design.

A generalized bias network 302 is shown with base connections 316 and 320, a collector connection 318, and connections 312 and 314 to the positive and negative supply voltage terminals. Oscillator performance may be improved by the use of semiconductors, for instance, to nonlinearly control the base-emitter voltages.

The feedback network 300 is shown in block diagram form with its input 308 connected to the amplifier output 318 and its output connected to the amplifier input 310. Feedback network connections are also shown to both supply voltage terminals. The feedback network - amplifier loop must provide a multiple of 360 degrees phase shift at the desired oscillation frequency. Numerous feedback networks are, of course, possible.

It may be desirable to realize this complementary transistor oscillator in integrated circuit form. Process constraints may require that PNP transistor 322 be configured as a combination of a lateral PNP and NPN transistor. In combination, this transistor pair is known to act similarly to a single PNP transistor. Also, Darlington NPN and PNP composite transistor arrangements are possible.

What is claimed is:

1. An oscillator circuit of the feedback amplifier type comprising:
   an amplifier having
      a PNP transistor, an NPN transistor, each of said transistors having an emitter, a base, and a collector, a positive and a negative supply terminal for connections to supply voltage potentials of respective relative polarities, a direct current conducting impedance connection of said PNP emitter to said positive supply terminal, and said NPN emitter to said negative supply terminal, wherein said impedance connections may be of negligibly low value, a common connection node for said NPN and PNP collectors, output of said amplifier, and output of said oscillator circuit, a base bias circuit having
 first and second inputs, said first input being the input of said amplifier,
 first and second outputs,
 signal coupling means from said first input to said first and second outputs,
 said second input is connected to said amplifier output,
 said first input is connected to said PNP base,
 said second output is connected to said NPN base,
 whereby said base bias circuit provides direct current biasing to said bases to initiate and sustain oscillation on power up, a phase-shifting feedback network having connections from said amplifier output to the input of said feedback network, and from the output of said feedback network to said amplifier input, wherein a regenerative feedback loop exists to sustain an oscillation at a fundamental frequency, and means for generating substantial odd harmonic frequency components of said fundamental frequency at said oscillator circuit output.

2. The oscillator of claim 1 wherein said means for generating odd harmonic frequency components includes driving said transistors to saturation, and a resultant self-limiting of said oscillator circuit output signal by said supply voltage sources, whereby approximate squarewave signals are obtained.

3. The oscillator of claim 1 wherein said base bias circuit consists of passive components.

4. The oscillator of claim 1 wherein at least one of said transistors is replaced by a composite transistor having an equivalent emitter, base, and collector.

5. The oscillator of claim 3 wherein a capacitor is connected from said amplifier input to at least one of said bases and wherein a direct connection is made to any remaining one of said bases.

6. The oscillator of claim 3 wherein said amplifier base bias circuit comprises a resistive connection of substantial value from said PNP base to said amplifier output, and a resistive connection of substantial value from said NPN base to said amplifier output.

7. The oscillator of claim 6 wherein said amplifier base bias circuit comprises a resistive connection from the base of said PNP transistor to said negative supply terminal, and a resistive connection from the base of said NPN transistor to said positive supply terminal, whereby the minimum operating voltage of said supply is reduced.

8. The oscillator of claim 6 wherein the number of resistors in said base bias circuit is two.

9. The oscillator of claim 7 wherein the number of resistors in said base bias circuit is four.

10. An oscillator circuit of the feedback amplifier type comprising:
 an amplifier having
  a PNP transistor, an NPN transistor, each of said transistors having an emitter, base, and collector,
  means for direct current connections of said PNP and NPN emitters to positive and negative supply terminals, respectively,
  a relatively low direct current conducting impedance connection from said PNP collector to said NPN collector,
  an output having relatively low direct current conducting impedance connections to said PNP and NPN collectors,
  a base bias circuit having
   direct current bias means for said transistor bases,
   an input for said amplifier,
   signal coupling means from said amplifier input to each of said transistor bases,
   a connection to said amplifier output,
 a phase-shifting feedback network having
  an input and an output,
  connections from said amplifier output to said feedback network input and from said feedback network output to said amplifier input, wherein a regenerative feedback loop exists to sustain an oscillation having a fundamental frequency,
 a relatively high impedance load on said amplifier output, wherein waveforms of substantial harmonic frequency content are enabled to be present at said amplifier output, and
 an output of said oscillator circuit at said amplifier output.

11. The oscillator of claim 10 wherein any direct current conducting impedance connected from the base of a given said transistor is to a circuit node that increases the average base current for that given said transistor, whereby an improvement is obtained such as a reduction in operating supply voltage.

12. The oscillator of claim 10 wherein circuitry exclusive of said feedback network has no reactive components to alter said oscillator output, whereby facilitating generation of squarewaves at said oscillator output.

13. The oscillator of claim 12 wherein said base bias circuit consists of passive components.

14. The oscillator of claim 10 wherein the maximum and minimum voltage excursions of said oscillator output are substantially that of the voltages at said PNP and NPN emitters, respectively.

* * * * *